United States Patent

Yu

[11] Patent Number: 5,995,354
[45] Date of Patent: Nov. 30, 1999

[54] ELECTROSTATIC DISCHARGE PROTECTION CIRCUIT FOR RECORDING ELECTROSTATIC DISCHARGE EVENT

[75] Inventor: Ta-Lee Yu, Hsinchu Hsien, Taiwan

[73] Assignee: Winbond Electronics Corp., Hsinchu, Taiwan

[21] Appl. No.: 09/093,425

[22] Filed: Jun. 8, 1998

[30] Foreign Application Priority Data

Feb. 12, 1998 [TW] Taiwan ................................. 87101959

[51] Int. Cl.⁶ ..................................................... H02H 3/00
[52] U.S. Cl. ............................ 361/111; 361/56; 361/118; 361/127
[58] Field of Search ................................. 361/56, 58, 91, 361/111, 118, 127

[56] References Cited

U.S. PATENT DOCUMENTS

| 5,173,755 | 12/1992 | Co et al. .................................. 257/361 |
| 5,400,202 | 3/1995 | Metz et al. ................................. 361/56 |
| 5,717,558 | 2/1998 | Lynn et al. ................................. 361/56 |

*Primary Examiner*—Stephen W Jackson
*Attorney, Agent, or Firm*—Ladas & Parry

[57] ABSTRACT

An electrostatic discharge protection circuit is used to protect an internal circuit that is electrically connected to an integrated circuit pad. The electrostatic discharge protection circuit comprises an erasable programmable read only memory, a capacitor, and a load element. The erasable programmable read only memory is provided with one source/drain connected to the pad, another source/drain connected to a power node, and a control gate. The capacitor is connected between the control gate and the pad while the load element is connected between the control gate and the power node. When electrostatic discharge stress occurs to the pad, the erasable programmable read only memory enters breakdown and is programmed by means of coupling effect through the capacitor. Under normal operation, the erasable read only memory is turned off via the load element.

7 Claims, 4 Drawing Sheets

ELECTROSTATIC DISCHARGE PROTECTION CIRCUIT FOR RECORDING ELECTROSTATIC DISCHARGE EVENT

BACKGROUND OF THE INVENTION

1. Field of the Invention

The present invention generally relates to semiconductor integrated circuit technology. More specifically, it relates to an electrostatic discharge protection circuit which can record any electrostatic discharge event occurring during the phases of testing, installation, and use, etc.

2. Description of the Prior Art

Electrostatic discharge, ESD hereinafter, is a common phenomenon that occurs during the handling of semiconductor integrated circuit, IC hereinafter, devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Therefore, an ESD protection circuit is required to prevent ESD damage to the internal circuit of an IC.

FIG. 1 schematically depicts a conventional ESD protection circuit. In the drawing, reference numeral 1 designates an IC pad, which is electrically connected to the internal circuit 2 of the IC device. The conventional ESD protection circuit essentially comprises an N-type metal-oxide-semiconductor field-effect transistor (MOSFET) 10, which is configured with its drain connected to the IC pad 1, and with its gate and source tied to circuit grounding node $V_{SS}$. Accordingly, the breakdown of the NMOS device 10 provides a direct ESD discharge path from the pad 1 to $V_{SS}$.

However, except in the case that permanent damage is caused to the internal circuit 2, the conventional ESD protection circuit can not record whether or not any ESD event occurs during the phases of testing, installation, or use, etc.

SUMMARY OF THE INVENTION

Therefore, an object of the present invention is to provide an ESD protection circuit which can record any ESD event occurring during phases of testing, installation, and use, etc.

Another object of the present invention is to provide the ESD protection circuit arranged at an IC pad for protecting the internal circuit of an IC device from ESD damage.

The present invention achieves the above-indicated objects by providing an electrostatic discharge protection circuit for protecting an internal circuit that is coupled to a pad. The electrostatic discharge protection circuit comprises an erasable programmable read only memory, a capacitor, and a load element. The erasable programmable read only memory is provided with one source/drain connected to the pad, another source/drain connected to a power node, and a control gate. The capacitor is connected between the control gate and the pad while the load element is connected between the control gate and the power node.

When electrostatic discharge stress occurs to the pad, the erasable programmable read only memory enters breakdown and is programmed by means of a coupling effect through the capacitor. Under normal operation, the erasable read only memory is turned off via the load element.

Accordingly, the erasable programmable read only memory is programmed while entering breakdown such that any ESD event occurring during the phase of testing, installation, or use, can be recorded.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
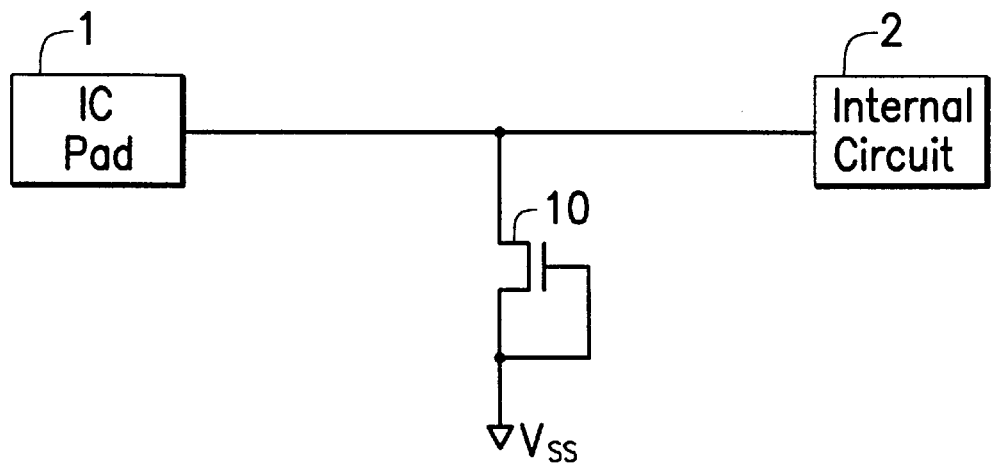
FIG. 1 schematically depicts a circuit diagram of a conventional ESD protection circuit.

FIGS. 2–7 exemplify several embodiments according to the present invention. In the drawings, reference numeral 1 designates an IC pad, which is electrically connected to an internal circuit 2 of an IC device. For recording an ESD event occurring during the phase of testing, installation, or use, an erasable programmable read only memory, in conjunction with a coupling device and a load element, is utilized to provide a direct discharge path between the IC pad 1 and $V_{DD}$ or between the IC pad 1 and $V_{SS}$.

First Embodiment

Figure 2:
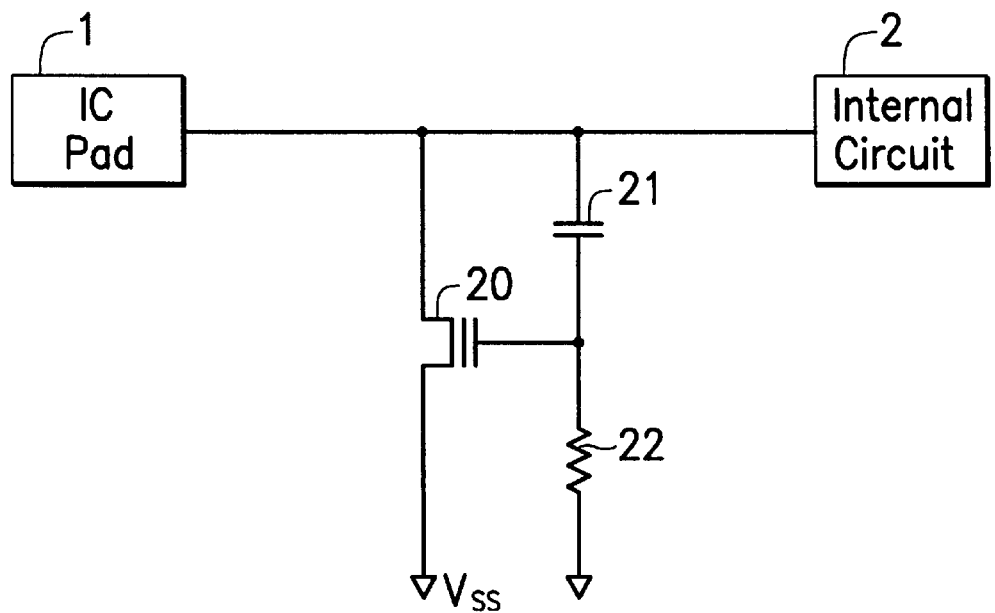
FIG. 2 schematically depicts a circuit diagram of an ESD protection circuit in accordance with the first preferred embodiment of the present invention.

Referring to FIG. 2, the circuit diagram of an ESD protection circuit in accordance with the first preferred embodiment of the present invention is schematically depicted. In this example, the ESD protection circuit comprises an N-type erasable programmable read only memory (EPROM) 20, a capacitor 21, and a resistor 22. The N-type EPROM 20 is configured with its drain connected to the IC pad 1 and its source connected to the power node $V_{SS}$. The capacitor 21 is connected between a control gate of the N-type EPROM 20 and the IC pad 1 while the resistor 22 is connected between the control gate and the power node $V_{SS}$.

When an ESD pulse positive to $V_{SS}$ occurs to the IC pad 1, the EPROM 20 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 20 enters breakdown, the capacitor 21 may couple a predetermined potential of about 6~14V to the control gate of the N-type EPROM 20. Thereby, hot carriers are generated near the drain-side junction and then injected into the floating gate through the gate oxide under the influence of the local high electric field. Such a process is referred to as programming. After programming, the threshold voltage of the N-type EPROM 20 can be increased, for example, from about 0.5V to the range of about 1.5~3V.

Programming the N-type EPROM 20 means to change the conductance or the threshold voltage thereof. Therefore, by measuring the conductance or threshold voltage of the N-type EPROM 20, whether the ESD stress occurs to the pad 1 during the phase of testing, installation, or even usage, can be acknowledged. For example, a measurement method can be implemented by applying a voltage at the control gate of the EPROM 20 an d reading the current value at the drain terminal.

Under normal operation, the control gate of the N-type EPROM 20 is grounded via the resistor 22 while the power node $V_{SS}$ is grounded to turn off the N-type EPROM 20; thereby, the control gate is free of floating.

Second Embodiment

Figure 3:
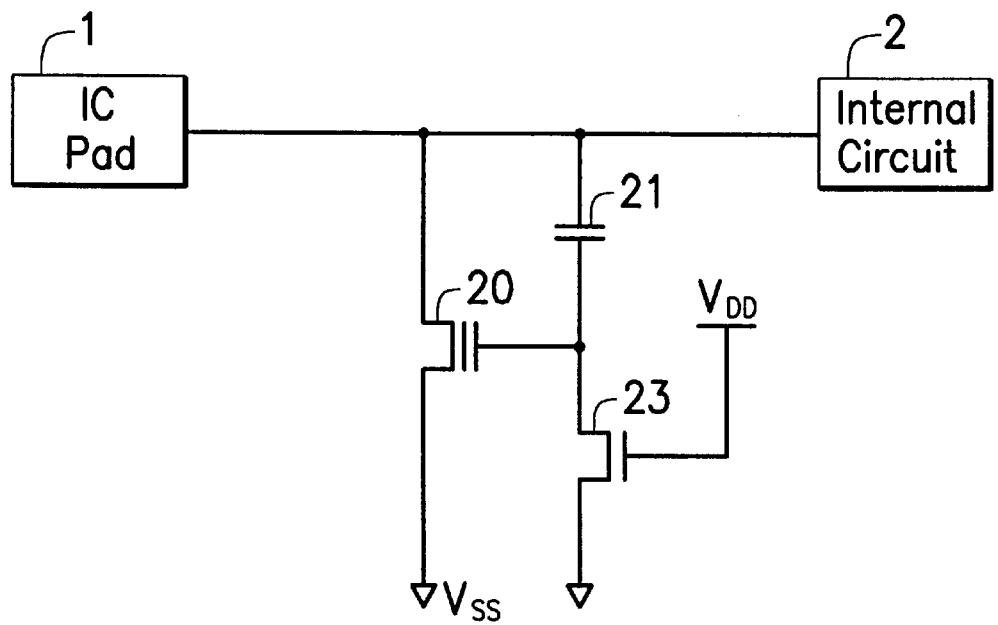
FIG. 3 schematically depicts a circuit diagram of an ESD protection circuit in accordance with the second preferred embodiment of the present invention.

Referring to FIG. 3, the circuit diagram of an ESD protection circuit in accordance with the second preferred embodiment of the present invention is schematically depicted. In this example, the ESD protection circuit comprises an N-type erasable programmable read only memory (EPROM) 20, a capacitor 21, and an NMOS device 23. The N-type EPROM 20 is configured with its drain connected to the ICp ad 1 and its source connected to the power node $V_{SS}$. The capacitor 21 is connected between the control gate of the N-type EPROM 20 and the IC pad 1. The NMOS device 23 is configured with its drain and source connected to the control gate and the power node $V_{SS}$, respectively, while its gate is connected to another power node $V_{DD}$.

When an ESD pulse positive to $V_{SS}$ occurs to the IC pad 1, the EPROM 20 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 20 enters breakdown, the capacitor 21 may couple a predetermined potential of about 6~14V to the control gate of the N-type EPROM 20. Thereby, hot carriers are generated near the drain-side junction and then injected into the floating gate through the gate oxide under the influence of the local high electric field. Such a process is referred to as programming. After programming, the threshold voltage of the N-type EPROM 20 can be increased, for example, from about 0.5V to the range of about 1.5~3V.

Programming the N-type EPROM 20 means to change the conductance or the threshold voltage thereof. Therefore, by measuring the conductance or threshold voltage of the N-type EPROM 20, whether the ESD stress occurs to the pad 1 during the phase of testing, installation, or even usage, can be acknowledged. For example, a measurement method can be implemented by applying a voltage at the control gate of the EPROM 20 and reading the current value at the drain terminal.

Under normal operation, the NMOS device 23 is turned on when the power node $V_{DD}$ is powered by 3.3V or 5V. Accordingly, the control gate of the N-type EPROM 20 can be grounded through the turned-on NMOS device 23 while the power node $V_{SS}$ is powered by 0V so as to turn off the N-type EPROM 20; thereby, the control gate is free of floating.

Third Embodiment

Figure 4:
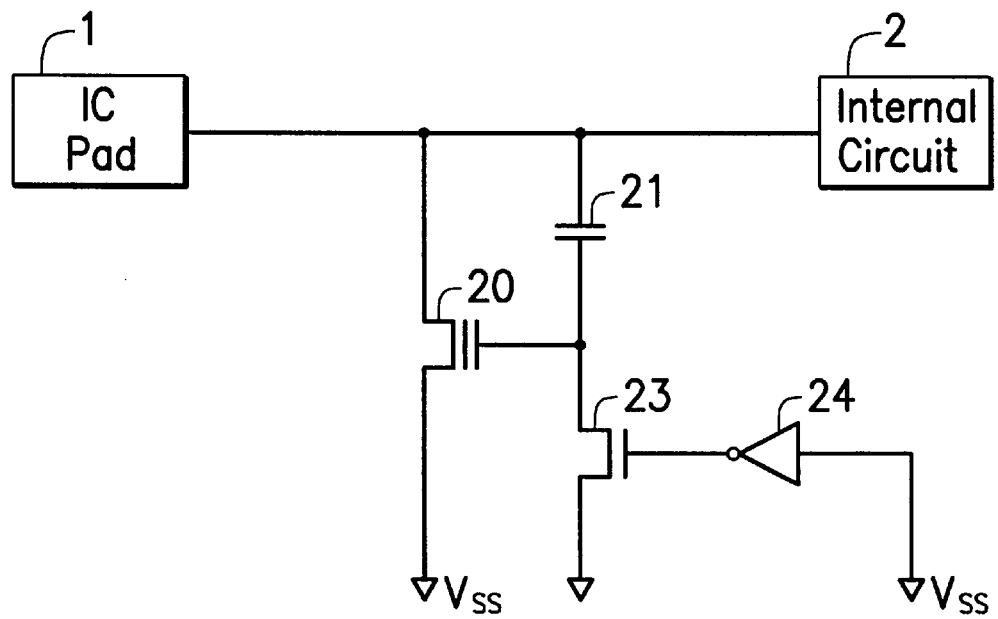
FIG. 4 schematically depicts a circuit diagram of an ESD protection circuit in accordance with the third preferred embodiment of the present invention.

Referring to FIG. 4, the circuit diagram of an ESD protection circuit in accordance with the third preferred embodiment of the present invention is schematically depicted. In this example, the ESD protection circuit comprises an N-type erasable programmable read only memory (EPROM) 20, a capacitor 21, an NMOS device 23, and an inverter 24. The N-type EPROM 20 is configured with its drain connected to the IC pad 1 and its source connected to the power node $V_{SS}$. The capacitor 21 is connected between the control gate of the N-type EPROM 20 and the IC pad 1.

The NMOS device 23 is configured with its drain and source connected to the control gate and the power node $V_{SS}$, respectively, while its gate is coupled to the power node $V_{SS}$ by the inverter 24. Preferably, the inverter 24 is configured with its input terminal connected to the power node $V_{SS}$, and its output terminal connected to the gate of the NMOS device 23.

When an ESD pulse positive to $V_{SS}$ occurs to the IC pad 1, the EPROM 20 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 20 enters breakdown, the capacitor 21 may couple a predetermined potential of about 6~14V to the control gate of the N-type EPROM 20; thereby, hot carriers are generated near the drain-side junction and then injected into the floating gate through the gate oxide under the influence of the local high electric field. Such a process is referred to as programming. After programming, the threshold voltage of the N-type EPROM 20 can be increased, for example, from about 0.5V to the range of about 1.5~3V.

Programming the N-type EPROM 20 means to change the conductance or the threshold voltage thereof. Therefore, by measuring the conductance or threshold voltage of the N-type EPROM 20, whether the ESD stress occurs to the pad 1 during the phase of testing, installation, or even usage can be acknowledged. For example, a measurement method can be implemented by applying a voltage at the control gate of the EPROM 20 and reading the current value at the drain terminal.

Under normal operation, the power node $V_{SS}$ is powered by 0V to turn on the NMOS device 23 through the inverter 24. Accordingly, the control gate of the N-type EPROM 20 can be grounded through the turned-on NMOS device 23 so as to turn off the N-type EPROM 20; thereby, the control gate is free of floating.

Fourth Embodiment

Figure 5:
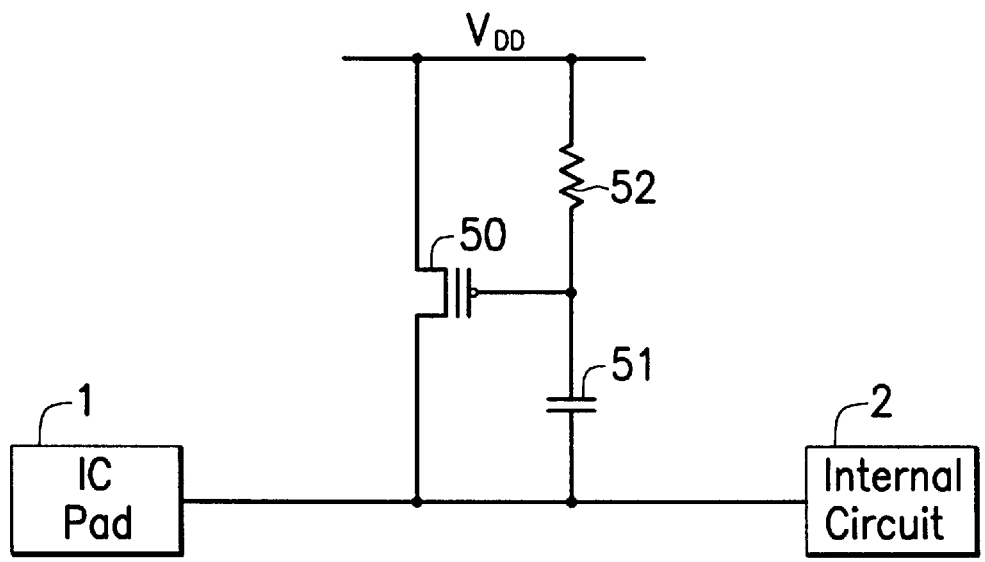
FIG. 5 schematically depicts a circuit diagram of an ESD protection circuit in accordance with the fourth preferred embodiment of the present invention.

Referring to FIG. 5, the circuit diagram of an ESD protection circuit in accordance with the fourth preferred embodiment of the present invention is schematically depicted. In this example, the ESD protection circuit comprises a P-type erasable programmable read only memory (EPROM) 50, a capacitor 51, and a resistor 52. The P-type EPROM 50 is configured with its drain connected to the IC pad 1 and its source connected to the power node $V_{DD}$. The capacitor 51 is connected between a control gate of the P-type EPROM 50 and the IC pad 1 while the resistor 52 is connected between the control gate and the power node $V_{DD}$.

When an ESD pulse negative to $V_{DD}$ occurs to the IC pad 1, the EPROM 50 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 50 enters breakdown, the capacitor 51 may couple a predetermined potential of about 6~14V to the control gate of the P-type EPROM 50. Thereby, hot carriers are generated near the drain-side junction and then injected into the floating gate through the gate oxide under the influence of the local high electric field. Such a process is referred to as programming. After programming, the threshold voltage of the P-type EPROM 50 can be increased, for example, from about 0.5V to the range of about 1.5~3V.

Programming the P-type EPROM 50 means to change the conductance or the threshold voltage thereof. Therefore, by measuring the conductance or threshold voltage of the P-type EPROM 50, whether the ESD stress occurs to the pad 1 during the phase of testing, installation, or even usage can be acknowledged. For example, a measurement method can be implemented by applying a voltage at the control gate of the EPROM 50 and reading the current value at the drain terminal.

Under normal operation, the control gate of the P-type EPROM 50 has the same potential as $V_{DD}$ via the resistor 52 while the power node $V_{DD}$ is powered by 3.3V or 5V to turn off the P-type EPROM 50; thereby, the control gate is free of floating.

Fifth Embodiment

Figure 6:
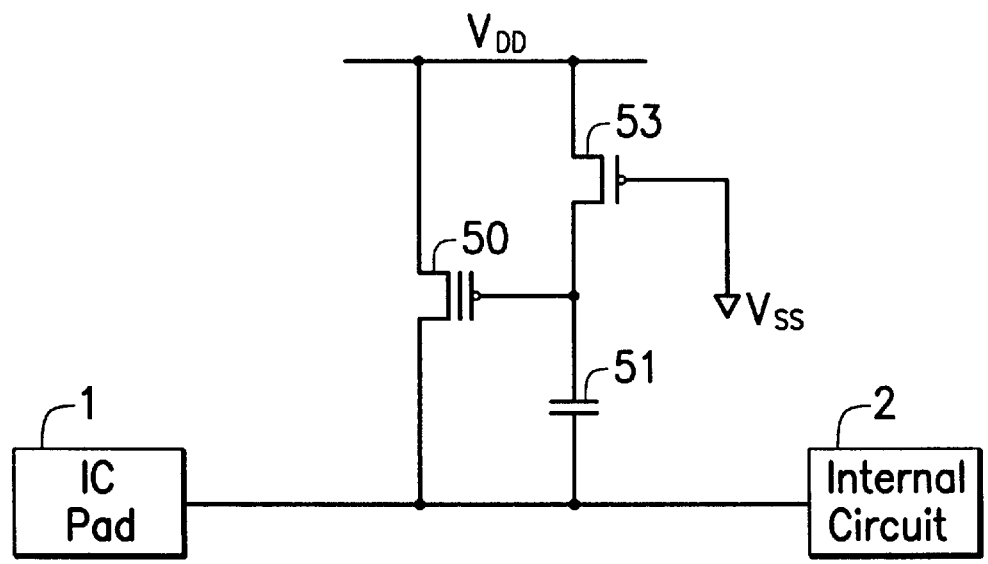
FIG. 6 schematically depicts a circuit diagram of an ESD protection circuit in accordance with the fifth preferred embodiment of the present invention.

Referring to FIG. 6, the circuit diagram of an ESD protection circuit in accordance with the fifth preferred embodiment of the present invention is schematically depicted. In this example, the ESD protection circuit comprises a P-type erasable programmable read only memory (EPROM) 50, a capacitor 51, and a PMOS device 53. The P-type EPROM 50 is configured with its drain connected to the IC pad 1 and its source connected to the power node $V_{DD}$. The capacitor 51 is connected between the control gate of the P-type EPROM 50 and the IC pad 1. The PMOS device 53 is configured with its drain and source connected to the control gate and the power node $V_{DD}$, respectively, while its gate is connected to the power node $V_{SS}$.

When an ESD pulse negative to $V_{DD}$ occurs to the IC pad 1, the EPROM 50 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 50 enters breakdown, the capacitor 51 may couple a predetermined potential of about 6~14V to the control gate of the P-type EPROM 50. Thereby, hot carriers are generated near the drain-side junction and then injected into the floating gate through the gate oxide under the influence of the local high electric field. Such a process is referred to as programming. After programming, the threshold voltage of the P-type EPROM 50 can be increased, for example, from about 0.5V to the range of about 1.5~3V.

Programming the P-type EPROM 50 means to change the conductance or the threshold voltage thereof. Therefore, by measuring the conductance or threshold voltage of the P-type EPROM 50, whether the ESD stress occurs to the pad 1 during the phase of testing, installation, or even usage can be acknowledged. For example, a measurement method can be implemented by applying a voltage at the control gate of the EPPOM 50 and reading the current value at the drain terminal.

Under normal operation, the PMOS device 53 is turned on when the power node $V_{SS}$ is powered by, for example, 0V. Accordingly, the control gate of the P-type EPROM 50 can has the same potential as $V_{DD}$ through the turned-on PMOS device 53 while the power node $V_{DD}$ is powered by 3.3V or 5V so as to turn off the P-type EPROM 50; thereby, the control gate is free of floating.

Sixth Embodiment

Figure 7:
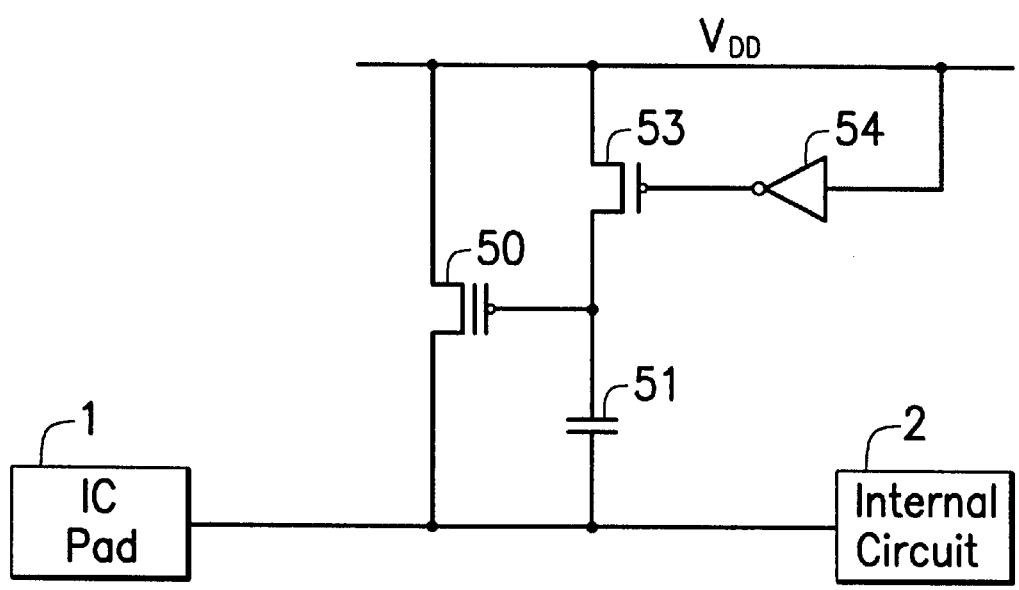
FIG. 7 schematically depicts a circuit diagram of an ESD protection circuit in accordance with the sixth preferred embodiment of the present invention.

Referring to FIG. 7, the circuit diagram of an ESD protection circuit in accordance with the sixth preferred embodiment of the present invention is schematically depicted. In this example, the ESD protection circuit comprises a P-type erasable programmable read only memory (EPROM) 50, a capacitor 51, a PMOS device 53, and an inverter 54. The P-type EPROM 50 is configured with its drain connected to the IC pad 1 and its source connected to the power node $V_{DD}$. The capacitor 51 is connected between the control gate of the P-type EPROM 50 and the IC pad 1. The PMOS device 53 is configured with its drain and source connected to the control gate and the power node $V_{SS}$, respectively, while its gate is coupled to the power node $V_{DD}$ by the inverter 54. Preferably, the inverter 54 is configured with its input terminal connected to the power node $V_{DD}$, and its output terminal connected to the gate of the PMOS device 53.

When an ESD pulse negative to $V_{DD}$ occurs to the IC pad 1, the EPROM 50 enters avalanche breakdown at the drain-side junction to conduct a current and thus bypass the ESD stress such that the internal circuit 2 does not suffer from ESD damage. The breakdown voltage ranges from about 6V to about 16V. Meanwhile, when the EPROM 50 enters breakdown, the capacitor 51 may couple a predetermined potential of about 6~14V to the control gate of the P-type EPROM 50. Thereby, hot carriers are generated near the drain-side junction and then injected into the floating gate through the gate oxide under the influence of the local high electric field. Such a process is referred to as programming. After programming, the threshold voltage of the P-type EPROM 50 can be increased, for example, from about 0.5V to the range of about 1.5~3V.

Programming the P-type EPROM 50 means to change the conductance or the threshold voltage thereof. Therefore, by measuring the conductance or threshold voltage of the P-type EPROM 50, whether the ESD stress occurs to the pad 1 during the phase of testing, installation, or even usage can be acknowledged. For example, a measurement method can be implemented by applying a voltage at the control gate of the EPROM 50 and reading the current value at the drain terminal.

Under normal operation, the power node $V_{DD}$ is powered by 3.3V or 5V to turn on the PMOS device 53 through the inverter 54. Accordingly, the control gate of the P-type EPROM 50 can has the same potential as $V_{DD}$ through the turned-on PMOS device 53 so as to turn off the P-type EPROM 50; thereby, the control gate is free of floating.

Any one of the preferred embodiments depicted in FIGS. 2–4 may be arranged integral with one of those preferred embodiments depicted in FIGS. 5–7 to provide respective discharge paths for both pad-to-$V_{SS}$ and pad-to-$V_{DD}$.

Preferably, the EPROMs 20 and 50 can be a split-gate flash memory or a stacked-gate flash memory.

In conclusion, the present invention, for recording any ESD event occurring during the phase of testing, installation, or use, makes use of an erasable programmable read only memory in conjunction with a coupling device and a load element to provide a direct discharge path between the IC pad 1 and $V_{DD}$ or between the IC pad 1 and $V_{SS}$.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. An electrostatic discharge protection circuit for protecting an internal circuit which is coupled to a pad, said electrostatic discharge protection circuit comprising:

an erasable programmable read only memory having one source/drain connected to said pad, another source/drain connected to a power node, and a control gate;

a capacitor connected between said control gate and said pad; and a load element connected between said control gate and said power node; wherein said erasable programmable read only memory enters breakdown and is programmed by means of a coupling effect through said capacitor when electrostatic discharge stress occurs to said pad, wherein said erasable read only memory is turned off via said load element under normal operation.

2. The electrostatic discharge protection circuit as claimed in claim 1, wherein said erasable programmable read only memory is an N-channel device.

3. The electrostatic discharge protection circuit as claimed in claim 1, wherein said erasable programmable read only memory is a P-channel device.

4. The electrostatic discharge protection circuit as claimed in claim 1, wherein said load element is a resistor.

5. The electrostatic discharge protection circuit as claimed in claim 1, wherein said load element is an N-type field-effect transistor to be turned on under said normal operation.

6. The electrostatic discharge protection circuit as claimed in claim 1, wherein said erasable programmable read only memory is a split-gate flash memory.

7. The electrostatic discharge protection circuit as claimed in claim 1, wherein said erasable programmable read only memory is a stacked-gate flash memory.

* * * * *